(12) United States Patent
Lam

(10) Patent No.: US 8,044,526 B2
(45) Date of Patent: Oct. 25, 2011

(54) INTEGRATED CIRCUIT ASSEMBLIES WITH ALIGNMENT FEATURES AND DEVICES AND METHODS RELATED THERETO

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/784,389

(22) Filed: May 20, 2010

(65) Prior Publication Data

US 2010/0225009 A1 Sep. 9, 2010

Related U.S. Application Data

(63) Continuation of application No. 11/616,479, filed on Dec. 27, 2006, now abandoned.

(51) Int. Cl.
*H01L 23/544* (2006.01)
(52) U.S. Cl. ................................. 257/797; 257/E23.179
(58) Field of Classification Search .................... 257/797
See application file for complete search history.

(56) References Cited

U.S. PATENT DOCUMENTS

| | | | |
|---|---|---|---|
| 5,216,806 A | | 6/1993 | Lam |
| 6,048,744 A | * | 4/2000 | Corisis et al. .................... 438/15 |
| 6,300,018 B1 | * | 10/2001 | Dilley et al. ....................... 430/5 |
| 6,455,933 B1 | * | 9/2002 | Akram et al. ................... 257/738 |
| 7,087,992 B2 | | 8/2006 | Chua et al. |
| 2001/0012643 A1 | | 8/2001 | Asada |
| 2001/0033014 A1 | | 10/2001 | Koh |
| 2002/0037598 A1 | | 3/2002 | Koh |
| 2002/0168797 A1 | | 11/2002 | DiStefano et al. |
| 2003/0042603 A1 | | 3/2003 | Koh |
| 2005/0032070 A1 | | 2/2005 | Raimundo et al. |
| 2006/0032070 A1 | | 2/2006 | Biggs et al. |
| 2008/0160670 A1 | | 7/2008 | Lam |

FOREIGN PATENT DOCUMENTS

WO    WO-2008/083028 A1    7/2008

OTHER PUBLICATIONS

"U.S. Appl. No. 11/616,479, Final Office Action mailed Jan. 22, 2010", 6 pgs.
"U.S. Appl. No. 11/616,479, Interview Summary and Final Office Action mailed Feb. 22, 2010", 8 pgs.
"U.S. Appl. No. 11/616,479, Non-Final Office Action mailed May 14, 2009", 9 pgs.
"U.S. Appl. No. 11/616,479, Response filed Oct. 29, 2009 to Restriction Requirement mailed Sep. 29, 2009", 10 pgs.
"U.S. Appl. No. 11/616,479, Response filed Aug. 14, 2009 to Non-Final Office Action mailed May 14, 2009", 9 pgs.
"U.S. Appl. No. 11/616,479, Restriction Requirement mailed Sep. 29, 2009", 4 pgs.
International Patent Application No. PCT/US07/88321, Search Report mailed Apr. 24, 2008, 2 pgs.
"International Patent Application No. PCT/US07/88321, Written Opinion mailed Apr. 24, 2008", 6 pgs.

* cited by examiner

*Primary Examiner* — David Zarneke
(74) *Attorney, Agent, or Firm* — Fish & Richardson P.C.

(57) ABSTRACT

A method of packaging an integrated circuit die including forming a mask window having a first aperture with a first set of alignment edges and forming an alignment feature on an uppermost surface of the integrated circuit die where the alignment feature has a second set of alignment edges. The alignment feature is inserted into the first aperture. The integrated circuit die is mechanically biased until the first and second set of alignment edges are in physical contact with one another and the alignment feature is secured into the mask window, thus forming an integrated circuit die assembly.

18 Claims, 16 Drawing Sheets

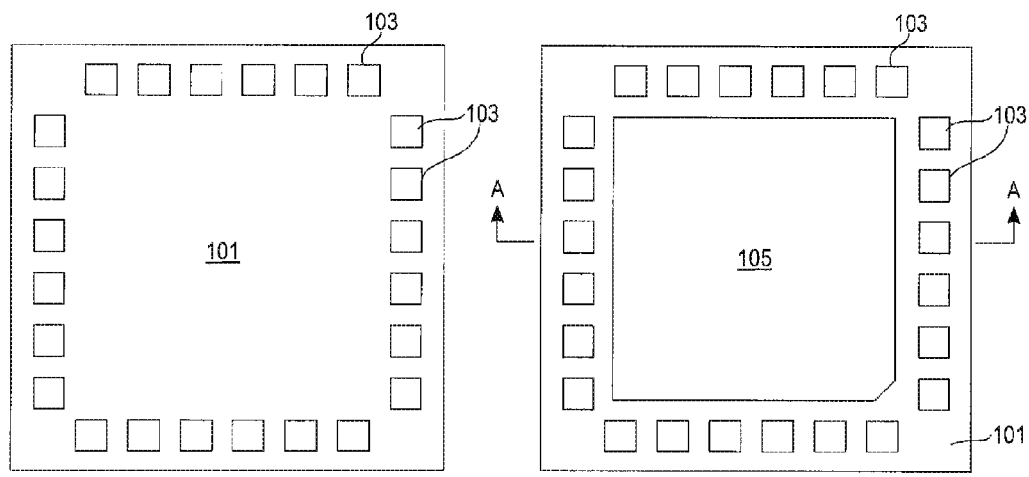
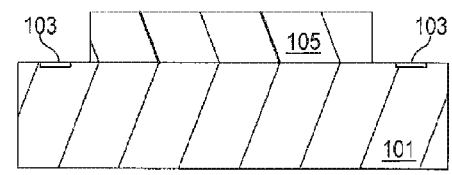
SECTION A - A
*Fig._1A*

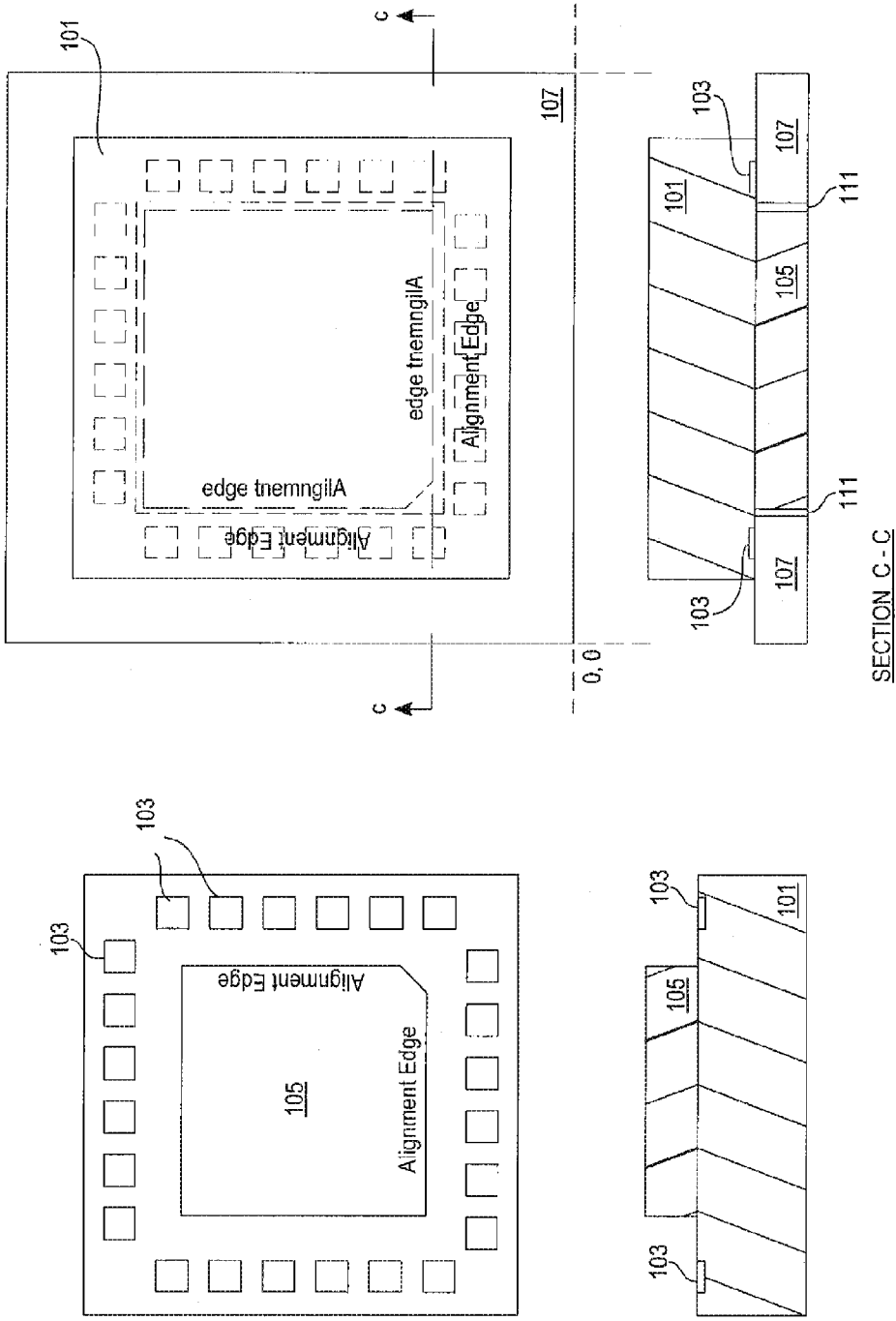

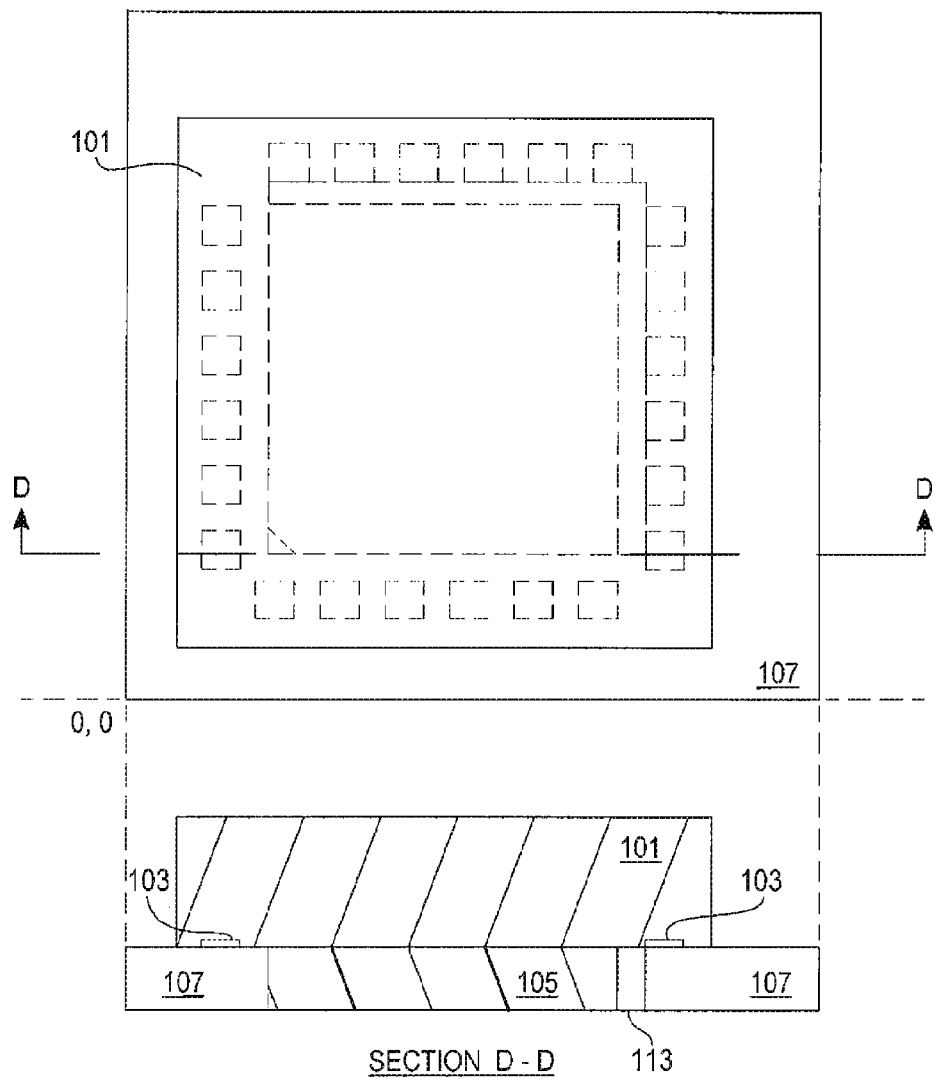
Fig._1D

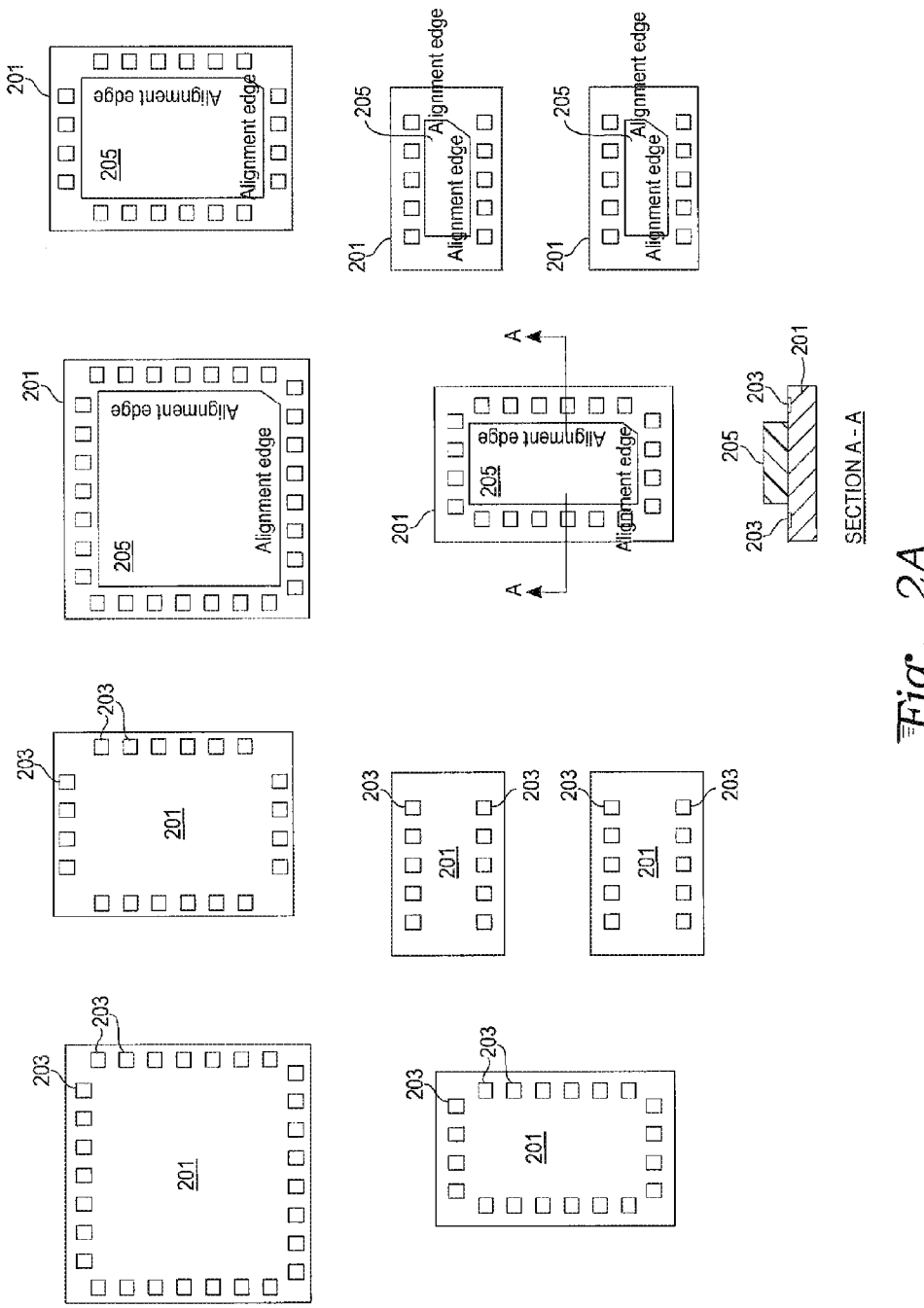
Fig. _ 2A

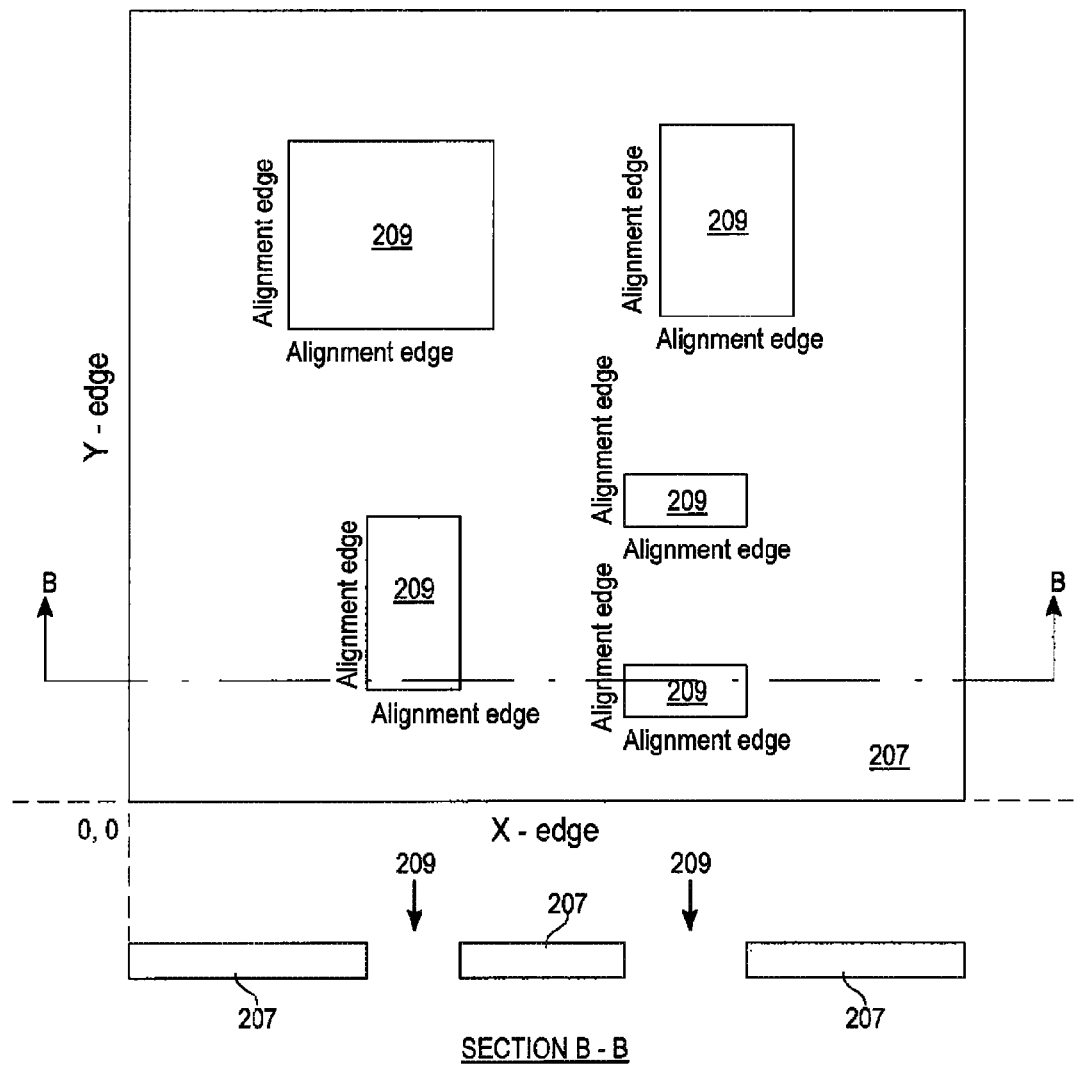
Fig. _2B

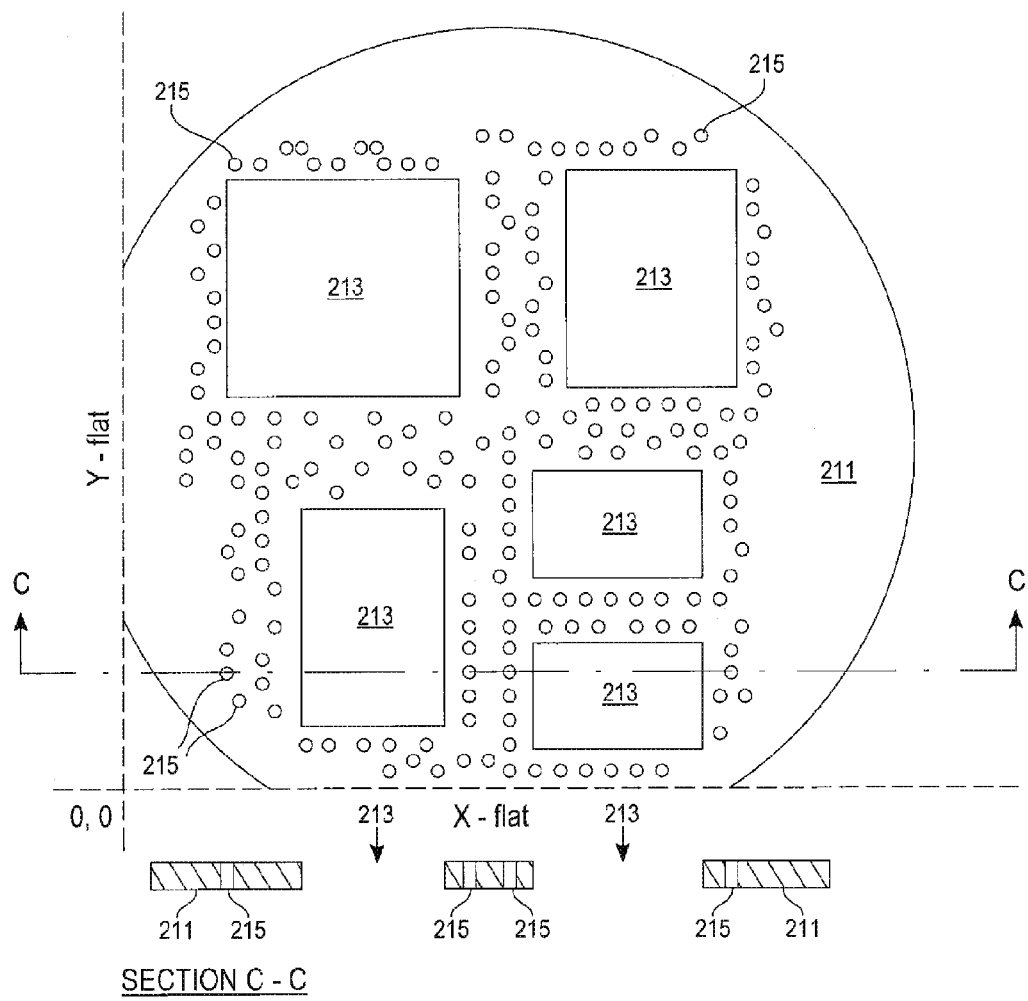
Fig._2C

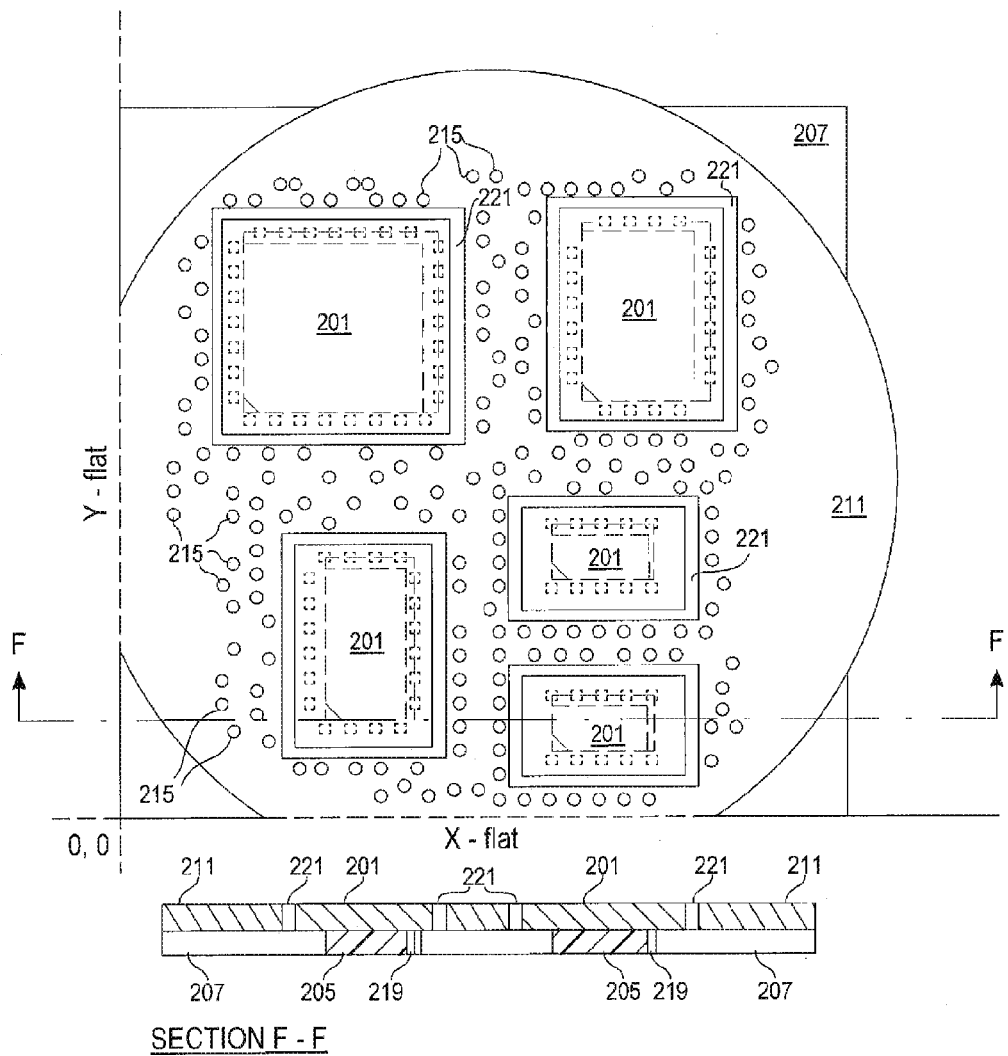
Fig._ 2F

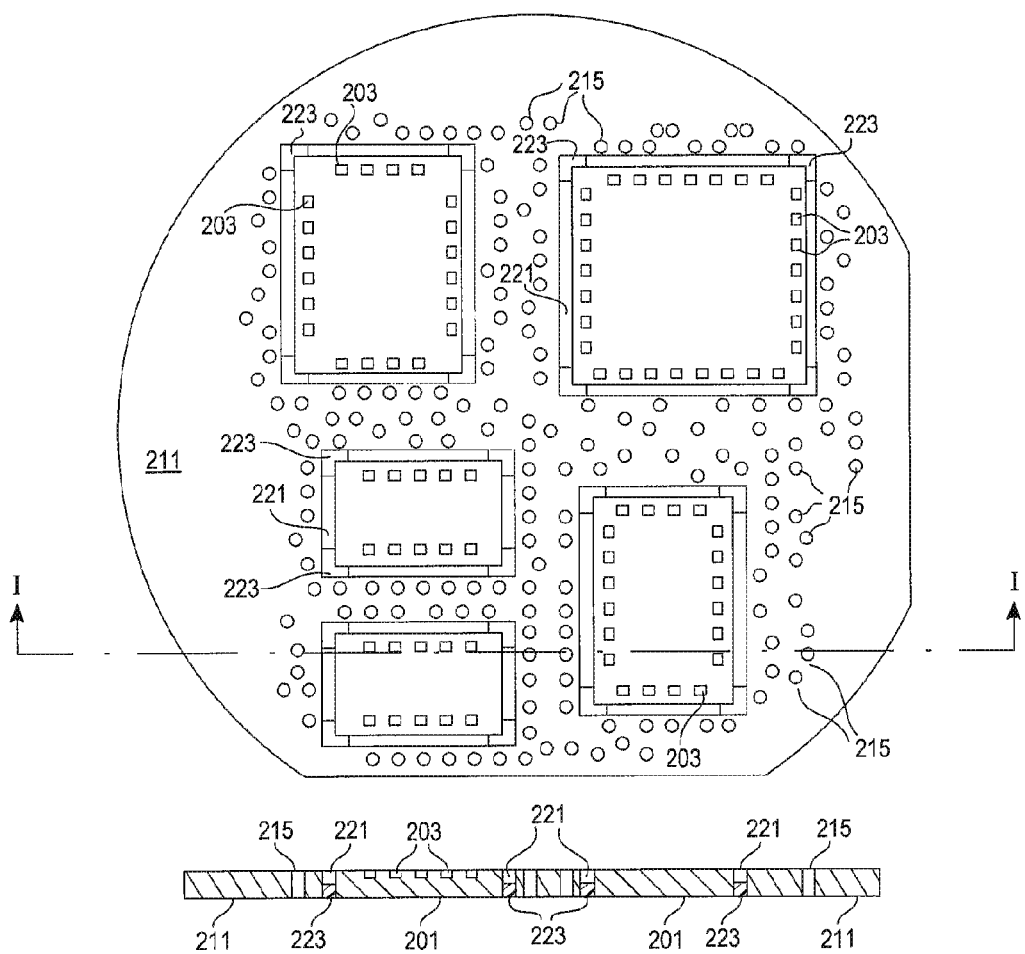
Fig._21

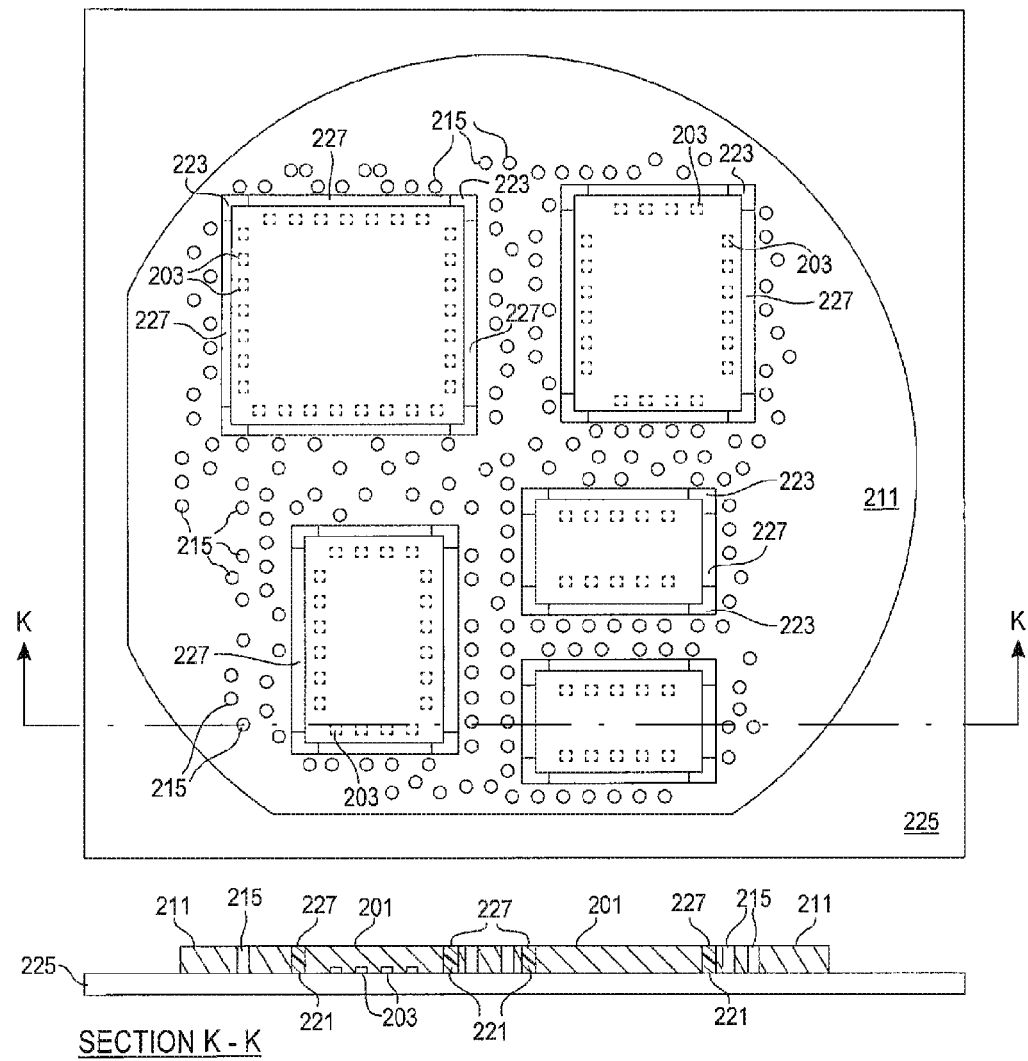
Fig._ 2K

INTEGRATED CIRCUIT ASSEMBLIES WITH ALIGNMENT FEATURES AND DEVICES AND METHODS RELATED THERETO

RELATED APPLICATIONS

This application is a continuation of U.S. patent application Ser. No. 11/616,479, filed on Dec. 27, 2006, now abandoned which is incorporated herein by reference in its entirety.

TECHNICAL FIELD

The present invention relates generally to semiconductor device packaging. More particularly, the present invention relates to wafer level multichip packaging such as, for example, a system in a package solution.

BACKGROUND ART

Semiconductor integrated circuit dice are ubiquitous in many contemporary consumer products. As semiconductor dice get smaller and more complex, problems associated with making electrical connections between semiconductor dice and printed circuit boards or intermediate substrates such as multichip modules have been addressed with a variety of constantly evolving solutions.

Flip-chip technologies using solder balls or bumps have helped to alleviate some of these problems. For example, instead of wire bonding, balls of solder may be formed at the locations of the bond pads of a semiconductor die. The semiconductor die is flipped upside down so the solder balls are placed on the contact pads of a carrier substrate. A solder reflow process heats the solder balls until the solder begins to flow and bond with a corresponding contact pad of a carrier substrate.

Another prior art packaging implementation provides for mounting a variety of integrated circuit dice on a substrate. In this implementation, a plurality of known good dice are mounted within cavities formed in the substrate. Redistribution and interconnect layers are formed terminating in electrical connections such as conductive bumps or balls. The substrate cavities receive signal device connections, such as conductive bumps, of a plurality of semiconductor dice in a flip-chip configuration. A portion of the substrate's back surface is then removed to a depth sufficient to expose the conductive bumps. In a related prior art solution, the cavities receive the semiconductor dice with their active surfaces facing up and metal layer connections are formed and connected to bond pads or other electrical connectors of the semiconductor dice.

However, in light of contemporary semiconductor device packages, there is a continued need for a reliable and cost effective solution for mounting integrated circuit dice into a single package. All solutions disclosed to date either require expensive and time-consuming fabrication steps to fabricate bumps or balls or demand an extraordinarily high-level of placement precision of the dice within a substrate. Therefore, what is needed is an economical, efficient, and reliable method to mount and interconnect singulated dice onto a substrate.

SUMMARY

In an exemplary embodiment, the present invention is a method of packaging an integrated circuit die including forming a mask window having a first aperture with a first set of alignment edges and forming an alignment feature on an uppermost surface of the integrated circuit die where the alignment feature has a second set of alignment edges. The alignment feature is inserted into the first aperture. The integrated circuit die is mechanically biased until the first and second set of alignment edges are in physical contact with one another and the alignment feature is secured into the mask window, thus forming an integrated circuit die assembly.

In another exemplary embodiment, the present invention is a method of packaging an integrated circuit die including forming a mask window having a first aperture with a first set of alignment edges and forming an alignment feature on an uppermost surface of the integrated circuit die where the alignment feature has a second set of alignment edges. The alignment feature is inserted into the first aperture and the integrated circuit die is mechanically biased until the first and second set of alignment edges are in physical contact with one another. A windowed substrate having a second aperture is formed where the second aperture is larger than a size of the integrated circuit die. The windowed substrate is placed over the integrated circuit and a spacing gap between the integrated circuit die and the second aperture is substantially filled.

In another exemplary embodiment, the present invention is a method of packaging an integrated circuit die including forming an alignment feature on an uppermost surface of the integrated circuit die where the alignment feature has a first set of positioning features. The alignment feature is inserted into a mask window having a first aperture where the first aperture has a second set of positioning features. The integrated circuit die is mechanically biased until the first and second set of positioning features are in physical contact with one another. A windowed substrate having a second aperture being larger than a size of the integrated circuit die is placed over the integrated circuit and a spacing gap between the integrated circuit die and the second aperture is substantially filled.

In another exemplary embodiment, the present invention is a method of packaging a plurality of integrated circuit dice including forming an alignment features on an uppermost surface of each of the plurality of integrated circuit dice where each of the alignment feature has a first set of positioning features. Each of the alignment features is inserted into a mask window having a plurality of first apertures where each of the plurality of first apertures is larger than respective ones of the plurality of alignment features. Each of the plurality of first apertures also has a second set of positioning features. Each of the plurality of integrated circuit dice is mechanically biased until the first and second set of positioning features are all in physical contact with one another. A windowed substrate is placed over the plurality integrated circuit dice. The windowed substrate has a plurality of second apertures where each of the plurality of second apertures is larger than respective ones of the plurality of integrated circuit dice. A spacing gap between each of the integrated circuit dice and the respective second aperture is substantially filled.

BRIEF DESCRIPTION OF THE DRAWINGS

FIGS. 1A-1D show a single integrated circuit die (shown after singulation for clarity) packaged in accordance with an exemplary embodiment of the present invention.

FIGS. 2A-2L show a plurality of integrated circuit dice mounted in a substrate in accordance with an exemplary embodiment of the present invention.

DETAILED DESCRIPTION

Virtually any type of integrated circuit device may be utilized in accordance with specific exemplary embodiments of the present invention described herein. The techniques for fabricating various types of integrated circuit devices are known in the art and will not be discussed. Significantly, the production of the integrated circuit devices is unimportant for an appreciation of the present invention. Therefore, only details related to mounting the integrated circuit devices in a substrate will be described.

With reference to FIG. 1A, an integrated circuit die 101 is fabricated with a plurality of interconnects or contact pads 103. Although all features described are typically fabricated while the die is still in wafer form, a single die is shown for clarity and ease of understanding. A skilled artisan will recognize that techniques disclosed herein allow all integrated circuit dice on a wafer or from various wafers to be mass aligned, thus resulting in shorter and more efficient overall fabrication times.

An alignment feature 105 is formed over the integrated circuit die 101. The alignment feature 105 may be, for example, a photoresist layer or another photolithographically definable material. The alignment feature 105 is formed by standard photolithography techniques including exposing a photo-definable material such as, for example, photoresist, and developing and etching the material.

Figure 1B:
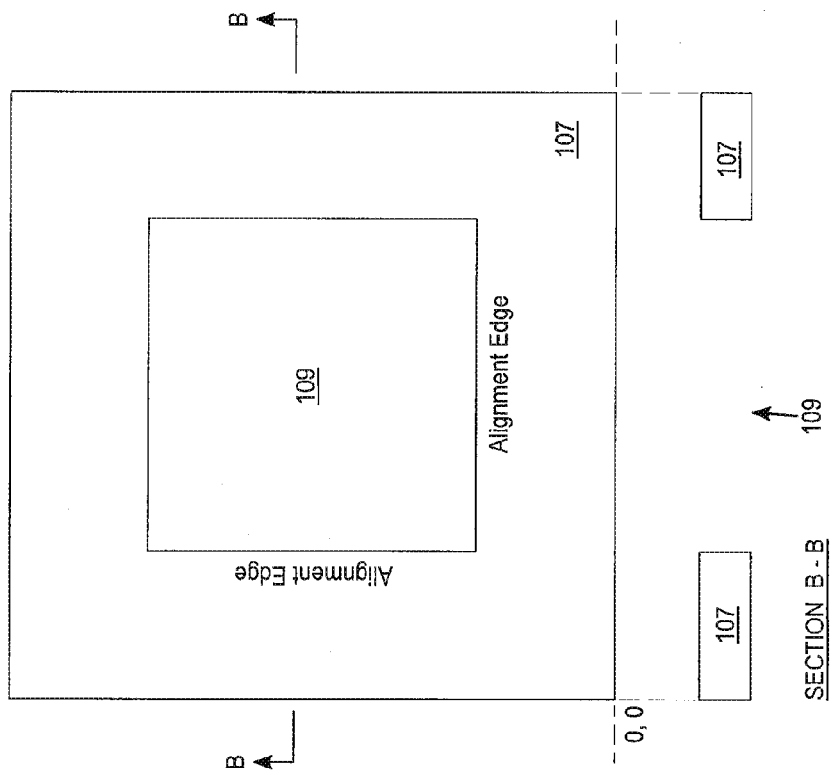
Figure 1B:
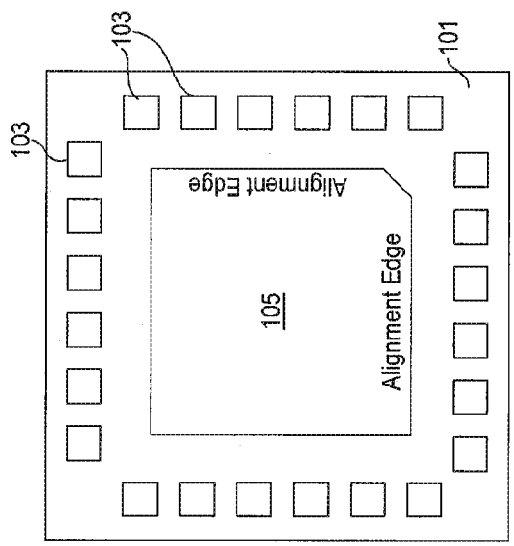

With continued reference to FIG. 1A and referring to FIG. 1B, in this exemplary embodiment the alignment feature 105 has two alignment edges. Since fabrication of the alignment edges is performed while the integrated circuit die 101 is still in wafer form, alignment of the alignment feature 105 relative to the contact pads 103 is readily achieved. Other alignment means may be readily envisioned by a skilled artisan and are within a scope of embodiments described herein. Such other means may include, for example, alignment to features etched or protruding from edges of the alignment feature 105. Such features are readily achievable by producing the features in a reticle used to expose the photo-definable material. As shown in the exemplary embodiment of FIG. 1A, a corner at the intersection of the two alignment edges has been chamfered. The chamfering helps prevent any misalignment issues which may otherwise arise in later edge alignment stages due to, for example, any excess material formed at the corner thus preventing a 90° intersection of the edges from being formed.

In FIG. 1B, a windowed alignment mask 107 includes a window 109. The window 109 has two edges arranged to allow precise and accurate positional referencing for the integrated circuit die 101.

In FIG. 1C, the integrated circuit die 101 with the alignment feature 105 is flipped and inserted into the windowed alignment mask 107. The alignment feature 105 thus drops into the window 109. At this stage in the process, no attempt is made to accurately position the integrated circuit die 101 with respect to the windowed alignment mask 107 as evidenced by a set of first spacing gaps 111. The first spacing gaps 111 are shown as a uniform gap between the alignment feature 105 and the windowed alignment mask 107 merely as an illustrational aid. Additionally, although the windowed alignment mask 107 and the alignment feature 105 are shown having the same thickness, there is no requirement for each element being of the same thickness as long as the alignment feature 105 is able to drop fully into the window 109 such that an uppermost surface of the integrated circuit die 101 (i.e., that surface containing the plurality of contact pads 103) is substantially coplanar and in contact with an uppermost portion of the windowed alignment mask 107.

In FIG. 1D, the alignment edges of the integrated circuit die 101 are mechanically biased relative to coordinate positions 0, 0 relative to alignment edges on the windowed alignment mask 107. The mechanical biasing may be achieved by, for example, pushing the integrated circuit die 101 with a small tool such as a vacuum pick (although vacuum assistance is not required). Optionally, the mechanical biasing may be achieved by tilting the windowed alignment mask 107 such that gravity allows the integrated circuit die 101 to be positioned correctly. After the mechanical biasing step is performed, the alignment edges of both the integrated circuit die 101 and the windowed alignment mask 107 are in physical contact leaving a set of second spacing gaps 113 on the top and right edges as indicated in the plan view of FIG. 1D. The second spacing gaps 113 are consequently larger than the first spacing gaps 111 of FIG. 1C as the mechanical biasing has removed portions of the first spacing gaps on the left and bottom edges. With the mechanical biasing completed, the integrated circuit die 101 is now aligned with respect to the windowed alignment mask 107. Various types of adhesives (e.g., an ultraviolet-curable adhesive) may be formed in the second spacing gaps 113 to prevent further movement of the integrated circuit die 101 with respect to the windowed alignment mask 107. The use of such adhesives and other filler materials are discussed in more detail below.

Techniques presented with reference to FIGS. 1A-1D generally provide an overview of the packaging concept disclosed herein. FIGS. 2A-2L describe in more complete detail how the packaging concept applies to a plurality of integrated circuit dice from a single wafer or integrated circuit dice generally (e.g., dice from different wafers or dice containing a variety of circuit types)

With reference to FIG. 2A, a plurality of integrated circuit dice 201 are shown. Each of the plurality of integrated circuit dice 201 has a plurality of interconnects or contact pads 203 and an alignment feature 205. The alignment feature 205 is formed over each of the plurality of integrated circuit dice 201. The alignment feature 205 may be, for example, a photoresist layer or another photolithographically definable material. The alignment feature 205 is formed by standard photolithography techniques including exposing a photo-definable material such as, for example, photoresist, developing, and etching the material.

In this exemplary embodiment, the alignment feature 205 has two alignment edges. Fabrication of the alignment feature 205 is performed while the integrated circuit die 201 is still in wafer form. Thus, a location of the alignment feature relative to the contact pads 203 is readily achieved since positional accuracy of the alignment features is equal to any other 30 photolithographic fabrication step.

In FIG. 2B a windowed alignment mask 207 includes a plurality of windows 209. Similar to FIG. 1B, each of the plurality of windows 209 has two edges arranged to allow precise and accurate positional referencing for the plurality of integrated circuit dice 201. The positional reference as shown here is relative to a coordinate of 0, 0. Each of the windows 209 corresponds to a position of each of the plurality of integrated circuit dice 201 in a final packaged form (not shown). Further, each of the plurality of windows 209 is slightly larger than an x-y dimension of a corresponding one of the alignment features 205 on the plurality of integrated circuit dice 201. The larger size allows easy insertion of the alignment features 205.

The windowed alignment mask 207 can be formed from, for example, organic or inorganic materials including glass, silicon, steel epoxy laminates, plastic polymers, and other materials known to one of skill in the art. Fabrication of the windowed alignment mask 207 may be accomplished by appropriate applications of machining, chemical etching, mechanical punching operations, or other techniques. A thickness of the windowed alignment mask 207 is typically equal to or greater than a maximum thickness of the plurality of integrated circuit dice 201.

With reference to FIG. 2C, a windowed substrate 211 includes a plurality of windows 213 and a plurality of vias 215. (The plurality of vias 215 is only an exemplary embodiment and relates to stacked combinations of semiconductor packages.) The windowed substrate 211 forms a base onto which the plurality of integrated circuit dice 201 will be placed into and embedded in subsequent operations. Each of the plurality of windows 213 corresponds with a particular one of the plurality of integrated circuit dice 201 and is slightly oversized with reference to a specific die to allow easy drop-in of the die. Further, each of the plurality of windows is positionally accurate and precise relative to a 0, 0 coordinate.

The windowed substrate 211 may be in a substantially round form as shown. In a specific exemplary embodiment, the windowed substrate 211 has two flatted edges as shown thus emulating a typical wafer form for 150 mm and smaller standard silicon wafers. In other exemplary embodiments, the windowed substrate 211 may be formed with notches to emulate 200 mm, 300 mm or larger wafers. In other exemplary embodiments, the windowed substrate 211 could be square or rectangular as required to suit a particular need.

Figure 2D:
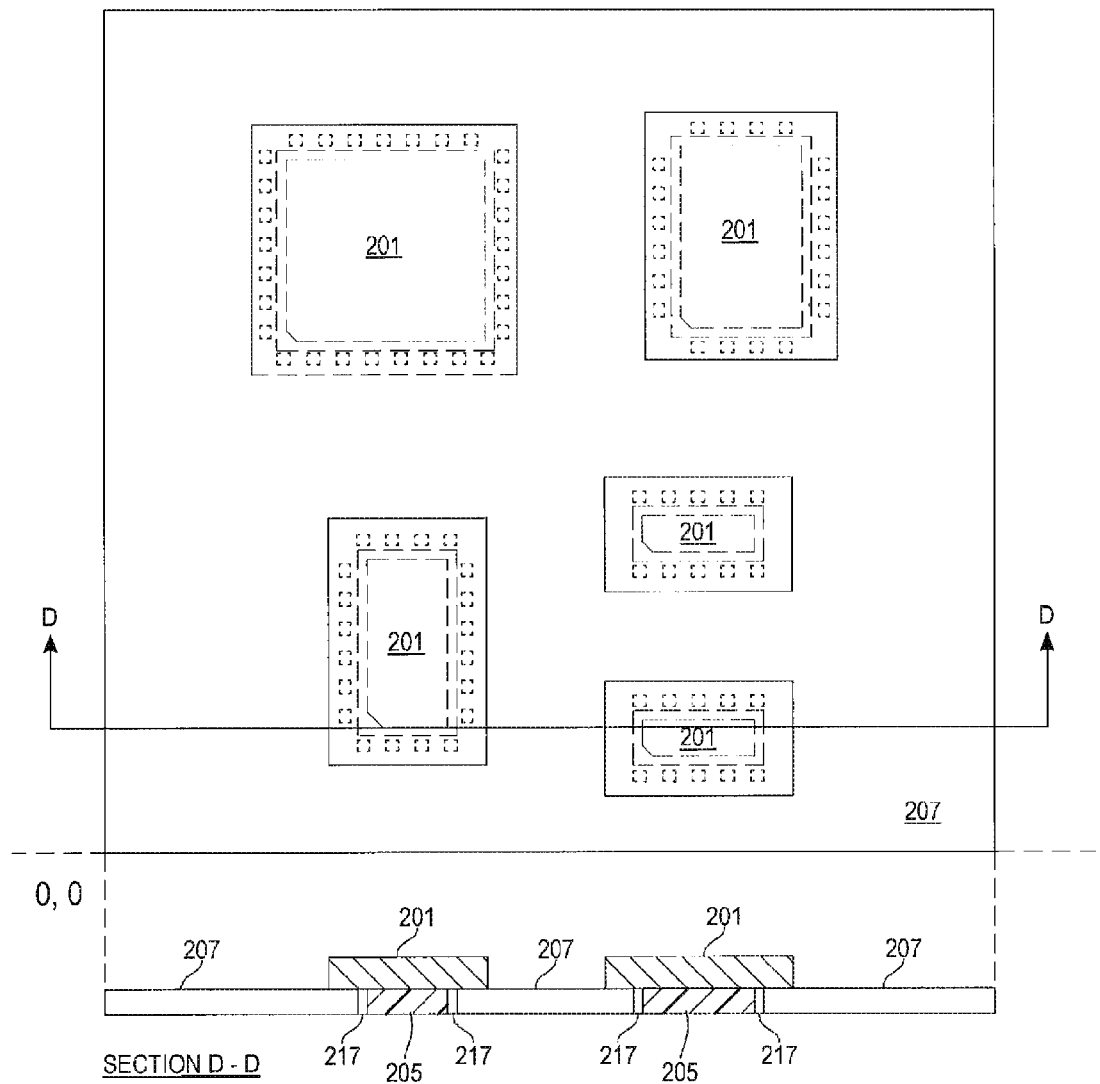

In FIG. 2D, each of the plurality of integrated circuit dice 201 is flipped and dropped into a corresponding window on the windowed alignment mask 207. Due to the slightly oversize nature of the plurality of windows 209 (FIG. 2B), a small first set of gaps 217 exists between each of the alignment features 205 and the corresponding window edge.

Figure 2E:
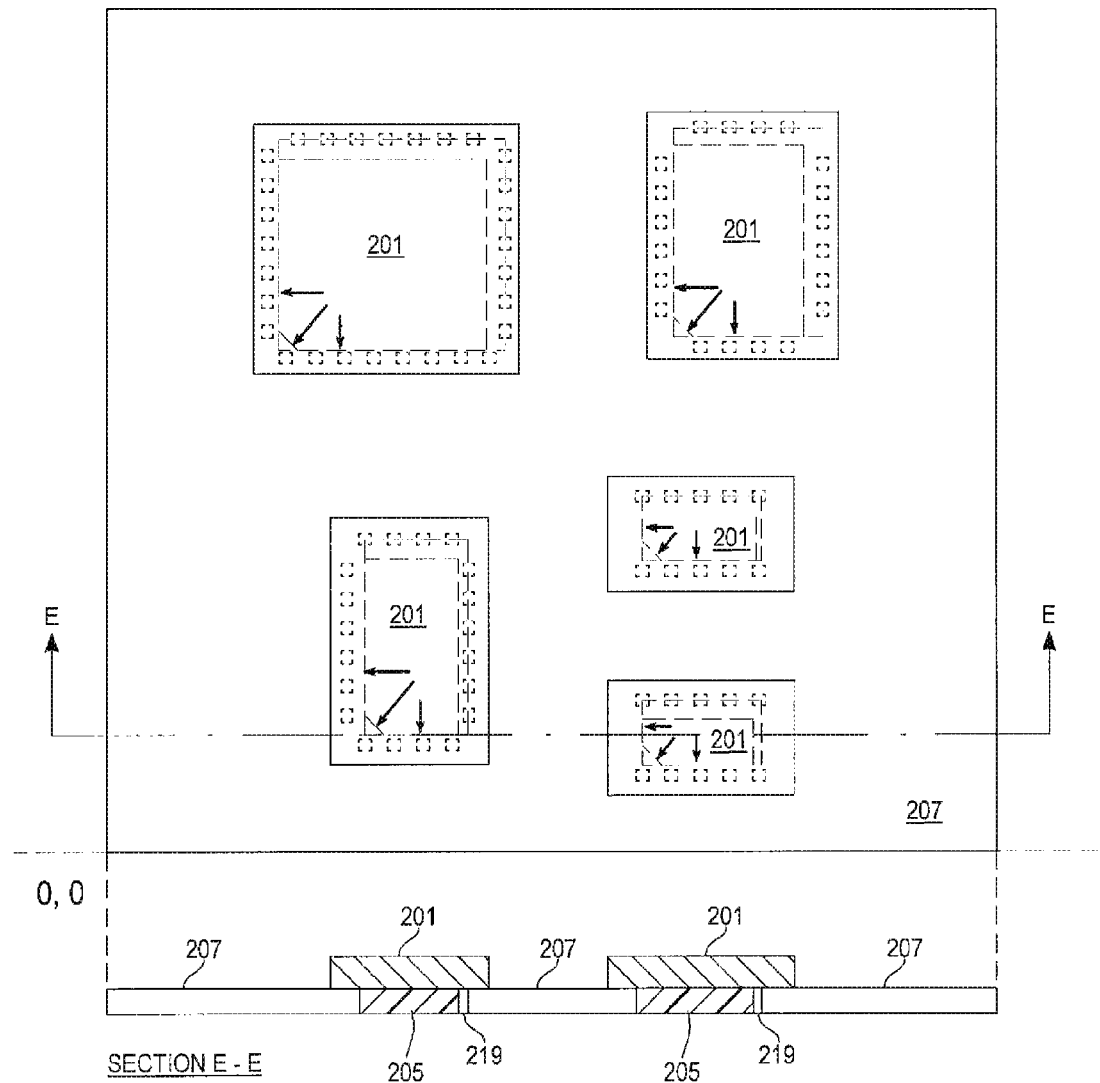

In FIG. 2E, the alignment edges of each of the plurality of integrated circuit dice 201 are mechanically biased relative to coordinate 0, 0 (i.e., toward the alignment edges) on the windowed alignment mask 207 as indicated by the arrows. The mechanical biasing may be achieved by, for example, pushing each of the plurality of integrated circuit dice 201 with a small tool such as a vacuum pick (although vacuum assistance is not required). Optionally, the mechanical biasing may be achieved by tilting the windowed alignment mask 207 such that gravity allows each of the plurality of integrated circuit dice 201 to be positioned correctly against the alignment edges. After the mechanical biasing step is performed, the alignment edges of the plurality of integrated circuit dice 201 and the windowed alignment mask 207 are in physical contact leaving a set of second spacing gaps 219 on the top and right edges as indicated in the plan view of FIG. 2E. The second set of spacing gaps 219 are consequently larger than the first set of spacing gaps 217 of FIG. 2D. With the mechanical biasing completed, each of the plurality of integrated circuit dice 201 is now aligned with respect to the windowed alignment mask 207.

With reference to FIG. 2F, the windowed substrate 211 is placed over the windowed alignment mask 207 which already contains the aligned plurality of integrated circuit dice 201. X-Y flats on the windowed substrate 211 are aligned with corresponding X-Y edges of the windowed alignment mask 207 as indicated in the plan view of FIG. 2F. A third set of gaps 221 now exist between edges of the plurality of integrated circuit dice 201 and inside edges of the plurality of windows 213 (FIG. 2C) in the windowed substrate 211.

Figure 2G:
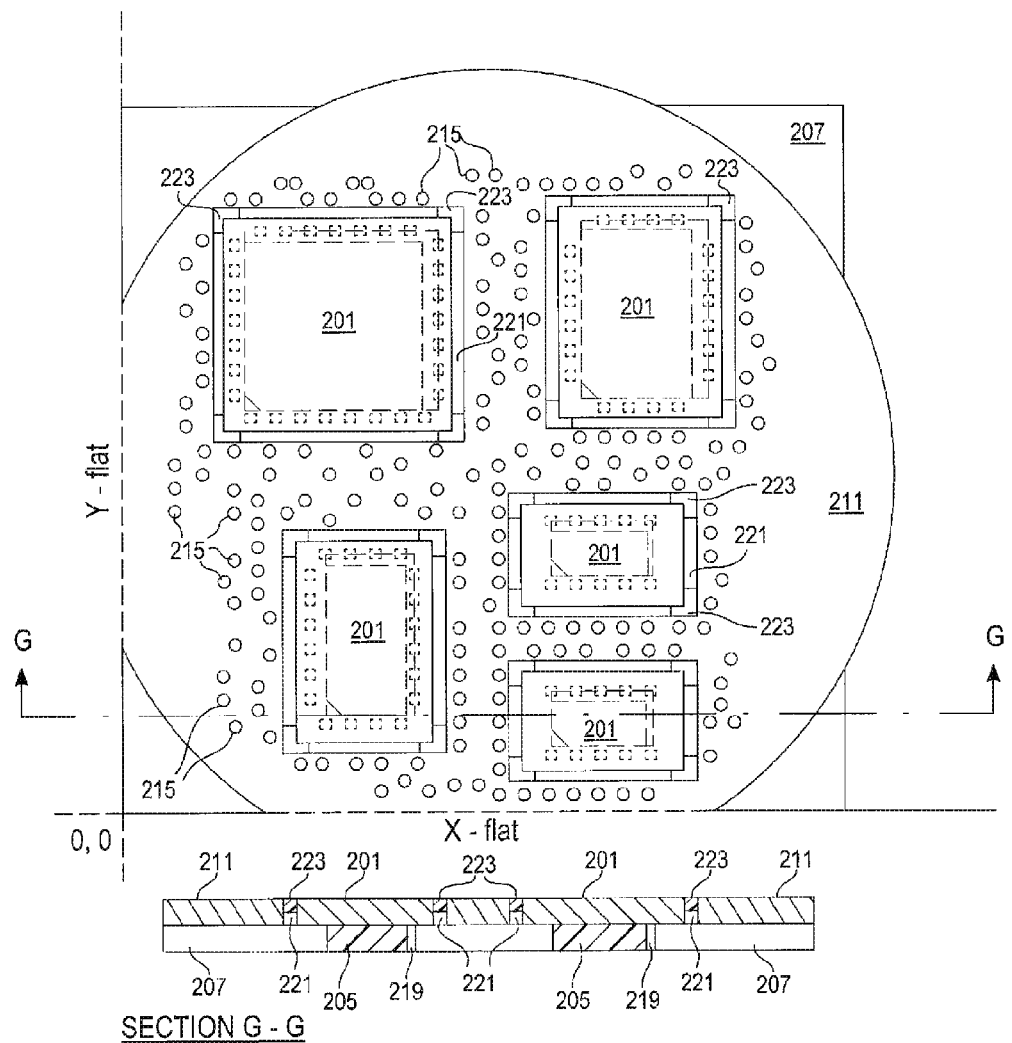

In FIG. 2G, a tack 223 is made in, for example, at least two corners to secure each of the plurality of integrated circuit dice 201 to the windowed substrate 211. (All four corners are tacked as indicated in the plan view of FIG. 2G.) The tack 223 may be a quick curing adhesive (e.g., a UV-curable adhesive) although a person of skill in the art will recognize that various other materials may readily be employed for this purpose as well. The tack 223 locks each of the plurality of integrated circuit dice 201 into its position relative to the windows 213 on the windowed substrate 211.

Figure 2H:
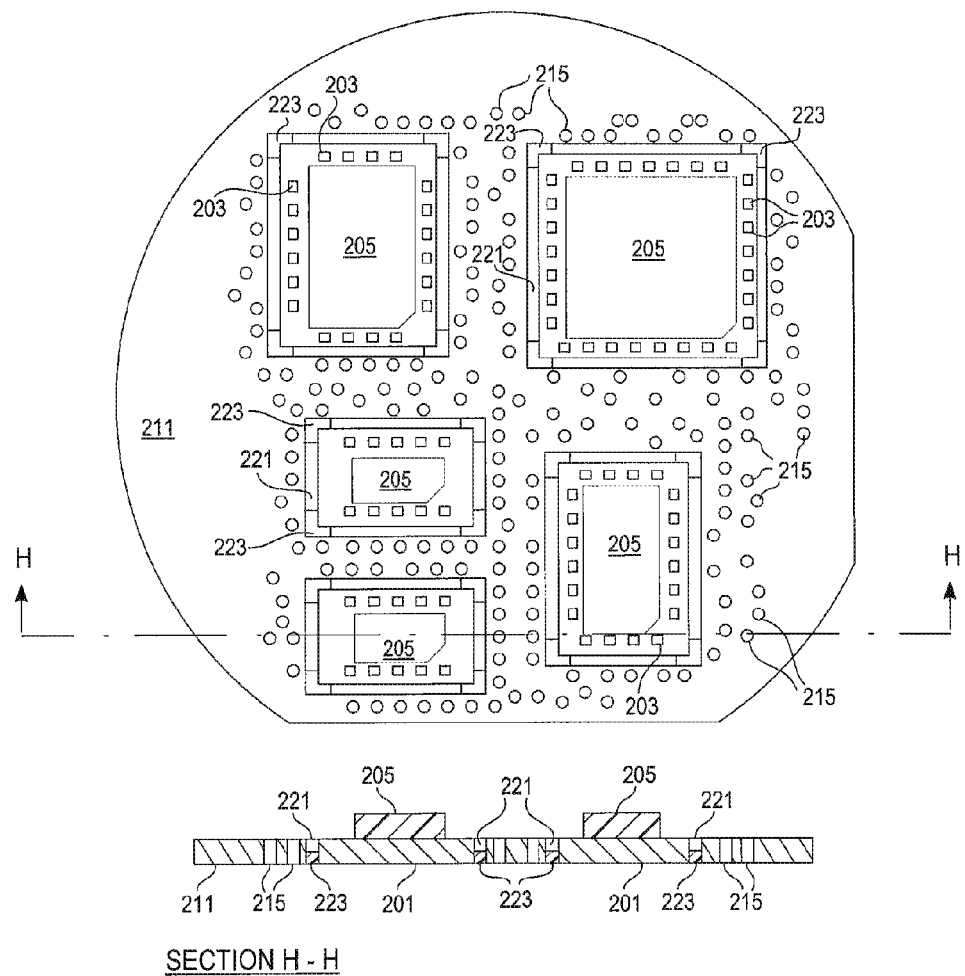

Once the plurality of integrated circuit dice 201 is locked into position with the tack 223, the windowed alignment mask 207 may be removed (FIG. 2H). Notice the cross-sectional view, Section H-H, in FIG. 2H is inverted with respect to FIG. 2G such that each of the plurality of alignment features 205 are now on top. The plurality of alignment features is then removed or stripped (FIG. 2I) by, for example, chemical or mechanical means which are well-known in the art.

Figure 2J:
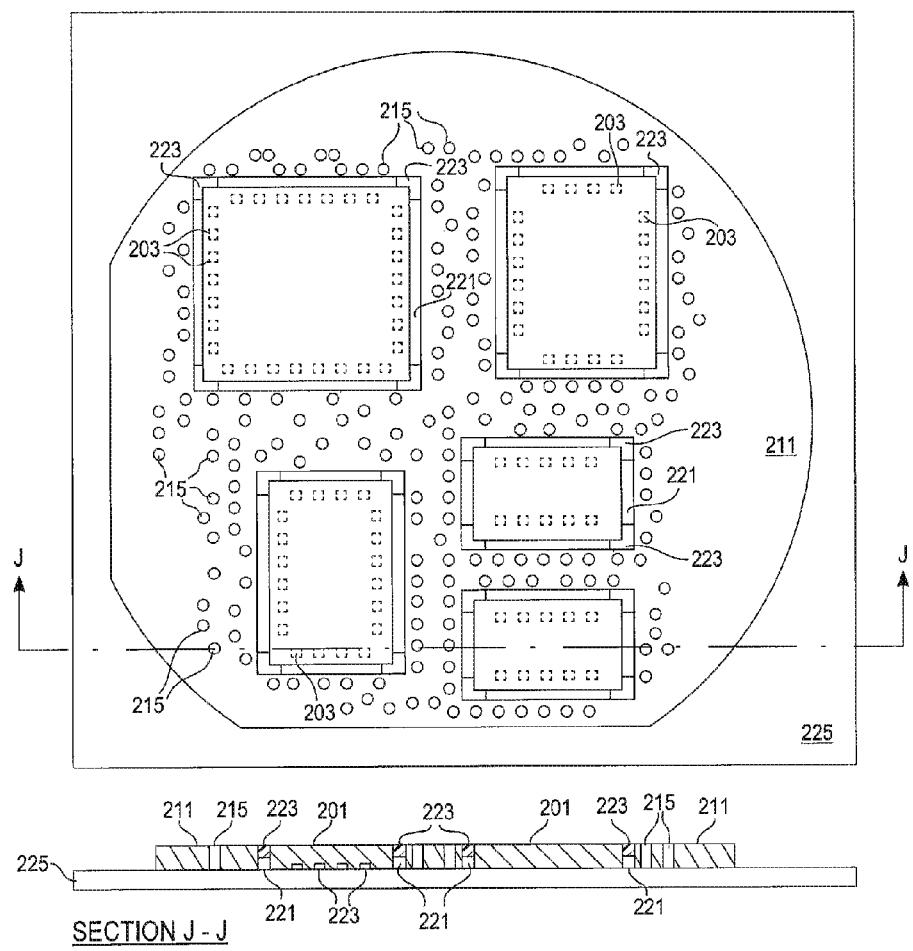

With reference to FIG. 2J, the windowed substrate 211 assembly is inverted and placed on a flat surface 225. In a specific exemplary embodiment, the flat surface is a high-release (e.g., non-stick) surface such as Teflon®. (Teflon® is a registered trademark of E.I. du Pont de Nemours and Company and is a synthetic resinous fluorine-containing polymer (polytetrafluoroethylene) commonly found in molding and extruding compositions, fabricated shapes such as sheets, tubes, tape, filaments, and emulsions.)

Figure 2L:
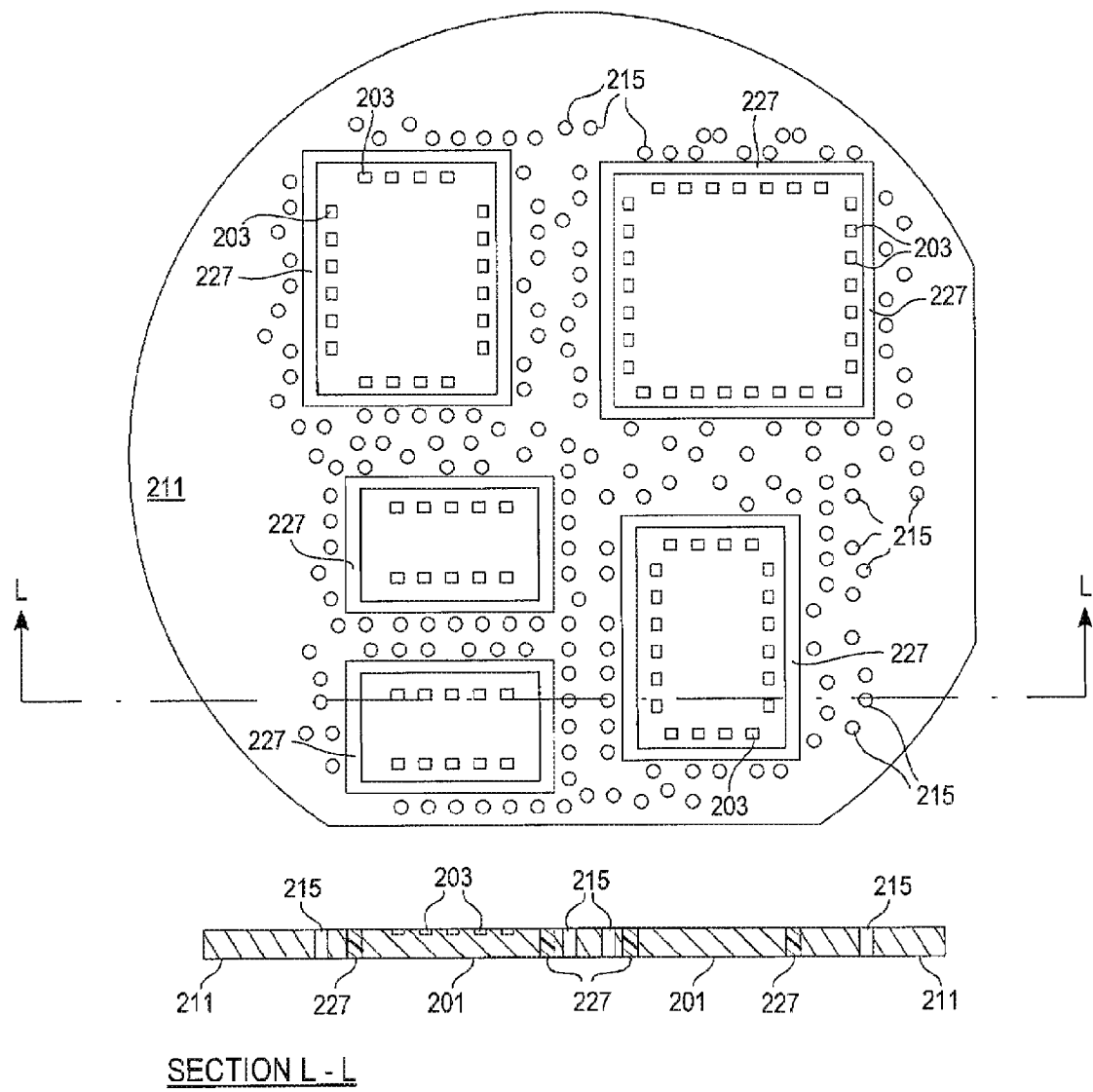

In FIG. 2K, the third set of gaps 221 (FIG. 2F) is substantially filled with a filler material 227. The filler material 227 may be, for example, an epoxy or polymer material and need only be filled sufficiently so as to prevent further movement of plurality of integrated circuit dice 201. The filler material 227 is cured and the windowed substrate 211 assembly is removed from the flat surface 225 (FIG. 2L). The plurality of integrated circuit dice 201 is precisely and accurately aligned with respect to each other and the plurality of vias 215 or other contact pads (not shown). Any additional levels of interconnect circuitry (not shown) are easily attached to each of the plurality of integrated circuit dice 201 on the windowed substrate 211 assembly.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that various types of materials may be used for forming the alignment features, alignment masks, and the substrates. Depending upon a particular application, various, types of formed, deposited, or machined plastics may be appropriate for some or all of the materials. In other applications, machined ceramics may be employed. Also, fabrication steps may be altered, modified, or omitted from the exemplary embodiment described herein and still result in a similar final package. For example, after the integrated circuit dice are mechanically biased the windowed substrate may be carefully placed, thus omitting the tacking operation. The specification and drawings are, accordingly, to be regarded in an illustrative rather than a restrictive sense.

What is claimed is:

1. An integrated circuit assembly comprising:
   at least one integrated circuit die;
   a windowed alignment mask located on a first surface of the at least one integrated circuit die and having at least one alignment mask window with a first set of alignment edges;
   an alignment feature located on an opposing second surface of the at least one integrated circuit die and having a second set of alignment edges, wherein the alignment feature is contained within the at least one alignment mask window and the first and second set of alignment edges are in physical contact with one another; and at least one spacing gap between the alignment feature and the alignment mask window, wherein the spacing gap is along an edge of either the alignment feature or the alignment mask window, and wherein the edge is opposite one of the edges of the first and second sets of alignment edges, and wherein the spacing gap is substantially filled with an adhesive.

2. The integrated circuit assembly of claim 1 wherein an uppermost surface of the at least one integrated circuit die is substantially coplanar with an uppermost portion of the windowed alignment mask.

3. The integrated circuit assembly of claim 1 further comprising a windowed substrate secured to the at least one integrated circuit die and having a substrate window larger in size than the at least one integrated circuit die.

4. The integrated circuit assembly of claim 1 wherein the windowed alignment mask is formed from glass, silicon, steel epoxy laminate, plastic polymer, or any combination thereof, further wherein the windowed alignment mask has a thickness equal to or greater than a maximum thickness of the at least one integrated circuit die.

5. The integrated circuit assembly of claim 4 wherein the thickness of the windowed alignment mask and the alignment feature is substantially the same.

6. The integrated circuit assembly of claim 1 wherein an intersection of the first and second sets of alignment edges is chamfered.

7. The integrated circuit assembly of claim 1 wherein the alignment feature is a photoresist layer.

8. The integrated circuit assembly of claim 1 comprising a plurality of integrated circuit dice located on a windowed substrate, each of the plurality of integrated circuit dice having the alignment feature, wherein each of the plurality of integrated circuit dice corresponds with a window in the windowed alignment mask.

9. An electronic device comprising:
at least one integrated circuit die;
a windowed alignment mask located on a first surface of the at least one integrated circuit die and having at least one alignment mask window with a first set of alignment edges;
an alignment feature located on an opposing second surface of the at least one integrated circuit die and having a second set of alignment edges, wherein the alignment feature is contained within the at least one alignment mask window and the first and second set of alignment edges are in physical contact with one another; and
at least one spacing gap between the alignment feature and the alignment mask window, wherein the spacing gap is along an edge of either the alignment feature or the alignment mask window, and wherein the edge is opposite one of the edges of the first and second sets of alignment edges, and wherein the spacing gap is substantially filled with an adhesive.

10. The electronic device of claim 9 further comprising a windowed substrate secured to the at least one integrated circuit die and having a substrate window larger in size than the at least one integrated circuit die.

11. The electronic device of claim 9 comprising a plurality of integrated circuit dice, each having the alignment feature, wherein each of the plurality of integrated circuit dice corresponds with a window in the windowed alignment mask.

12. The electronic device of claim 9 wherein an intersection of the first and second sets of alignment edges is chamfered.

13. A method of forming an integrated circuit assembly comprising:
forming a windowed alignment mask on a first surface of at least one integrated circuit die, wherein the window alignment mask has at least one alignment mask window with a first set of alignment edges;
forming an alignment feature having a second set of alignment edges, the alignment feature located on an opposing second surface of the at least one integrated circuit die;
containing the alignment feature within the at least one alignment mask window to form the integrated circuit die assembly, wherein the first and second set of alignment edges are in physical contact with one another; and
substantially filling at least one spacing gap with an adhesive, wherein the spacing gap is between the alignment feature and the alignment mask window, and wherein the spacing gap is along an edge of either the alignment feature or the alignment mask window, and wherein the edge is opposite one of the edges of the first and second sets of alignment edges.

14. The method of claim 13 further comprising:
forming a windowed substrate having a second alignment mask window larger than a size of the at least one integrated circuit die; and
placing the windowed substrate over the integrated circuit die.

15. The method of claim 13 further comprising chamfering an intersection of each of the first and second set of alignment edges.

16. The method of claim 13 further comprising securing the alignment feature into the at least one alignment mask window with an adhesive.

17. The integrated circuit assembly of claim 13 wherein the alignment feature which is contained within the at least one alignment mask window is inserted into and secured within the at least one alignment mask window.

18. The method of claim 13 wherein the containing step comprises:
inserting the alignment feature into the at least one alignment mask window;
mechanically biasing the at least one integrated circuit die until the first and second set of alignment edges are in physical contact with one another; and
securing the alignment feature into the at least one alignment mask window.

* * * * *

UNITED STATES PATENT AND TRADEMARK OFFICE
CERTIFICATE OF CORRECTION

| | | |
|---|---|---|
| PATENT NO. | : 8,044,526 B2 | Page 1 of 1 |
| APPLICATION NO. | : 12/784389 | |
| DATED | : October 25, 2011 | |
| INVENTOR(S) | : Ken Lam | |

It is certified that error appears in the above-identified patent and that said Letters Patent is hereby corrected as shown below:

Column 4, line 29, delete "types)" and insert -- types). --

Column 4, line 46, delete "other 30" and insert -- other --

Column 6, line 45, delete "various," and insert -- various --

Signed and Sealed this
Twentieth Day of December, 2011

David J. Kappos
*Director of the United States Patent and Trademark Office*